US011323065B2

(12) United States Patent
Lashkare et al.

(10) Patent No.: US 11,323,065 B2
(45) Date of Patent: May 3, 2022

(54) METHOD FOR FABRICATING NEURON OSCILLATOR INCLUDING THERMAL INSULATING DEVICE

(71) Applicant: Indian Institute of Technology Bombay, Mumbai (IN)

(72) Inventors: Sandip Gangadharrao Lashkare, Nanded (IN); Vivek Saraswat, Mumbai (IN); Pankaj Subhash Kumbhare, Nagpur (IN); Udayan Ganguly, Mumbai (IN)

(73) Assignee: INDIAN INSTITUTE OF TECHNOLOGY BOMBAY, Maharashtra (IN)

( * ) Notice: Subject to any disclaimer, the term of this patent is extended or adjusted under 35 U.S.C. 154(b) by 0 days.

(21) Appl. No.: 17/059,244

(22) PCT Filed: May 28, 2019

(86) PCT No.: PCT/IN2019/050416
§ 371 (c)(1),
(2) Date: Nov. 26, 2020

(87) PCT Pub. No.: WO2019/229770
PCT Pub. Date: Dec. 5, 2019

(65) Prior Publication Data
US 2021/0242831 A1     Aug. 5, 2021

(30) Foreign Application Priority Data
May 28, 2018  (IN) .............................. 201821019896

(51) Int. Cl.
*H03B 1/02*     (2006.01)
*G06N 3/04*     (2006.01)
(Continued)

(52) U.S. Cl.
CPC ................. *H03B 1/02* (2013.01); *G06N 3/04* (2013.01); *G06N 3/063* (2013.01); *H03B 5/20* (2013.01); *H03B 28/00* (2013.01); *H03B 29/00* (2013.01)

(58) Field of Classification Search
CPC ........ G06N 3/063; G06N 3/0635; H03B 1/02; H03B 28/00; H03B 29/00; H03B 5/20;
(Continued)

(56) References Cited

U.S. PATENT DOCUMENTS

| 2016/0125288 | A1* | 5/2016 | Pileggi | ................. | G06N 3/0635 706/29 |
| 2017/0324379 | A1* | 11/2017 | Kumar | ................. | H04L 27/001 |
| 2019/0036023 | A1* | 1/2019 | Yi | ................. | H01L 27/26 |

OTHER PUBLICATIONS

Parihar, Abhinav, et al. "Vertex coloring of graphs via phase dynamics of coupled oscillatory networks." Scientific reports 7.1 (2017): 1-11. (Year: 2017).*

(Continued)

*Primary Examiner* — Ryan Johnson

(57) ABSTRACT

Accordingly the embodiments herein provide a method for fabricating a neuron oscillator (200a). The neuron oscillator (200a) includes a thermal insulating device connected with a resistor and a capacitor in series to produce self-sustained oscillations, where the resistor and the capacitor are arranged in parallel manner. The neuron oscillator (200a) eliminates a requirement of an additional compensation circuitry for a consistent performance over a time under heating issues. Additionally, an ON/OFF ratio of the neuron oscillator (200a) improves to a broader resistor range. Further, a presence of tunable synaptic memristor functionality of the neuron oscillator (200a) provides a reduced fabrication complexity to a large scale ONN. An input voltage required for the neuron oscillator (200a) is low (2-3 V) which makes it suitable to use with existing circuitries (Continued)

without using any additional converters. Additionally, an amplitude of the oscillations is a significant fraction of an applied bias which eliminates a need for an amplification.

18 Claims, 7 Drawing Sheets

(51) Int. Cl.
    *G06N 3/063*     (2006.01)
    *H03B 5/20*     (2006.01)
    *H03B 29/00*     (2006.01)
    *H03B 28/00*     (2006.01)

(58) Field of Classification Search
    CPC . H03B 7/06; H03B 7/00; H03K 4/787; H03K 4/08; H03K 4/50
    See application file for complete search history.

(56) References Cited

OTHER PUBLICATIONS

Lane, "Vanadium Dioxide Breaks The Scientific Mold With Game-Changing Properties", Apr. 5, 2017, retrieved from http://science.unctv.org/content/scienceblog/vanadium-dioxide-game-changing-properties on Sep. 9, 2021 (Year: 2017).*

Zimmers, A., et al. "Role of thermal heating on the voltage induced insulator-metal transition in VO 2." Physical review letters 110.5 (2013): 056601. (Year: 2013).*

Kumbhare, P., et al. "Memory performance of a simple Pr 0.7 Ca 0.3 MnO 3-based selectorless RRAM." IEEE Transactions on Electron Devices 64.9 (2017): 3967-3970. (Year: 2017).*

Pergament, Alexander, et al. "Vanadium dioxide: metal-insulator transition, electrical switching and oscillations. A review of state of the art and recent progress." arXiv preprint arXiv:1601.06246 (2016). (Year: 2016).*

* cited by examiner

METHOD FOR FABRICATING NEURON OSCILLATOR INCLUDING THERMAL INSULATING DEVICE

FIELD OF INVENTION

The present disclosure relates to oscillatory neural networks, and more specifically to a method for fabricating a neuron oscillator including a thermal insulating device. The present application is based on, and claims priority from an Indian Application Number 201821019896 filed on 28th May, 2018 and PCT/IN2019/050416 filed on 28th May, 2019 the disclosure of which is hereby incorporated by reference herein

BACKGROUND OF INVENTION

An energy efficient computing have huge demand in electronic devices such as smartphones, tablets etc. A conventional Von-Neumann architecture is inefficient in solving certain non-deterministic polynomial time (NP) hard problems like a pattern recognition, a combinatorial optimization etc. Various neural network architectures are being explored extensively which are energy efficient and can be used for multi-tasking operations. An oscillatory neural network (ONN) is the neural network which uses phase dynamics of oscillator neurons to solve complex tasks like the pattern recognition, an image classification and a vertex coloring by mimicking a rhythmic activity in a thalamocortical neuron system. A hardware realization of the ONN is essential to determine an efficiency in solving these complex tasks.

Although, complementary metal oxide semiconductor (CMOS) schemes are applied in a design of ring oscillators, Schmitt trigger based oscillators, where these oscillators are used for the hardware realization of the ONN. However, the hardware realization is challenged by issues like a frequency tunability, a complex circuit involving 10 to 20 transistors, a high power density etc. A device level, scalable oscillator based on engineerable physics is, therefore, more desirable. A key behavioural component in a CMOS oscillator is the Schmitt trigger that has a hysteresis loop in direct current (DC) Current-voltage (I-V) characteristics. To replicate such a behaviour in a single device, various physical phenomena in different non-silicon based materials have been exploited to develop nanoscale alternatives, such as volatile filamentation (not area scalable), metal to insulator transition or MIT (thermally unstable) and magnetic switching-based oscillators (small resistance ratio).

FIG. 1 is a circuit diagram of a directly coupled ONN with coupling elements and oscillator units (e.g., oscillator neuron), according to a prior art. Each coupling element includes a capacitor and a resistor. The coupling elements can be used as a tuneable synaptic memristor, where the coupling elements enable a variable coupling to the directly coupled ONN for specific applications. Further, the coupling elements can be used to reconfigure oscillator frequencies of the directly coupled ONN after a fabrication. Thus, a material which can be used in fabrication of dense oscillatory neurons and memristors simultaneously is most beneficial for an area efficient ONN. Further, an area scalable and a low powered oscillator neuron is essential for the hardware realization of the ONN. A transient joule heating induces a high non-linearity in the DC I-V characteristics of an area scalable $Pr_{1-x}Mn_xCaO_3$ (PCMO) based RRAM, where the DC I-V characteristics includes the hysteresis loop. The non-linearity keeps on increasing upon reducing a Ca composition (x). Further, the non-linearity is maximum at x=0 (i.e., $PrMnO_3$ (PMO)). The PMO is 300 times more thermally resistive than a silicon. A higher thermal resistance enables a thermal runaway and enhances the transient joule heating even at lower current levels (or at lower power densities) and causes the high non-linearity in the current.

Thus, it is desired to address above mentioned disadvantages or other shortcomings or at least provide a useful alternative.

OBJECT OF INVENTION

The principal object of the embodiments herein is to provide a method for fabricating a neuron oscillator including a thermal insulating device.

Another object of the embodiments herein is to connect the thermal insulating device with a resistor and a capacitor in series to produce self-sustained oscillations by the neuron oscillator.

SUMMARY

Accordingly the embodiments herein provide a neuron oscillator. The neuron oscillator includes a thermal insulating device connected with a resistor and a capacitor in series to produce self-sustained oscillations. The resistor and the capacitor are arranged in parallel manner.

In an embodiment, the thermal insulating device includes a silicon substrate, where the silicon substrate is thermally oxidized by a thermal oxidation process at a temperature to grow a silicon oxide. Further, the thermal insulating device includes a titanium and a platinum deposited on the silicon oxide by a sputtering process in an argon ambient. Further, the thermal insulating device includes a thermal insulating layer deposited by a radio frequency (RF) sputtering in an argon ambient at a room temperature. Further, the thermal insulating device includes a tungsten placed on the thermal insulating layer by a photolithography and a lift-off process.

In an embodiment, the temperature of the thermal oxidation process is 1000 degree Celsius.

In an embodiment, the titanium and the platinum act as a bottom contact for the thermal insulating layer.

In an embodiment, a stack of the silicon oxide, the titanium, the platinum, and the thermal insulating layer is annealed at 750 degree Celsius in a nitrogen ambient.

In an embodiment, the thermal insulating layer generates a transient joule heating based hysteretic thermal runaway in its direct-current current-voltage (DCIV) characteristics.

In an embodiment, the thermal insulating device comprises at least one of a praseodymium manganese oxide ($PrMnO_3$) device, praseodymium calcium manganese oxide ($PrCaMnO_3$) device, a calcium manganese oxide ($CaMnO_3$) device, and a lanthanum strontium manganite oxide (LSMO).

In an embodiment, the transient joule heating based hysteretic thermal runaway is caused due to minimal heat loss in the thermally insulating device.

In an embodiment, a voltage across the capacitor determines the voltage across the thermal insulating device so as to generate a low resistance state and a high resistance state.

In an embodiment, the low resistance state of the thermal insulating device generates charging and the high resistance state of the thermal insulating device generates discharging of the capacitor resulting in oscillations in the neuron oscillator.

In an embodiment, the neuron oscillator is used in a coupled oscillatory neural network.

In an embodiment, the neuron oscillator is used in a neuromorphic application.

Accordingly the embodiments herein provide a method for fabricating a neuron oscillator. The method includes placing a resistor and a capacitor in parallel. Further, the method includes connecting a thermal insulating device in series with the resistor and the capacitor to produce self-sustained oscillations.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This method is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
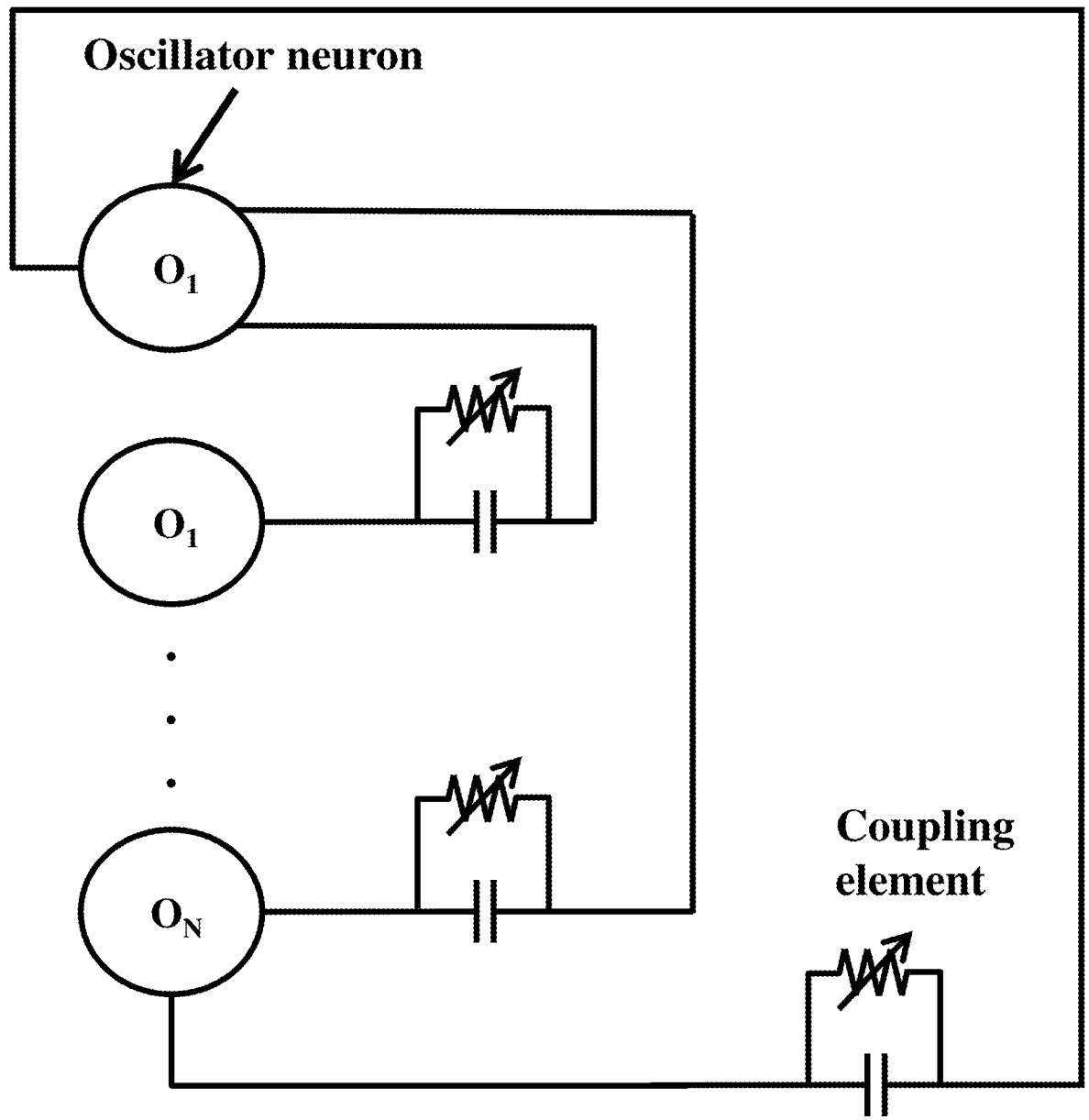
FIG. 1 is a circuit diagram of a directly coupled ONN with coupling elements and oscillator units, according to a prior art.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Accordingly the embodiments herein disclose a neuron oscillator. The neuron oscillator includes a thermal insulating device connected with a resistor and a capacitor in series to produce self-sustained oscillations, where the resistor and the capacitor are arranged in parallel manner.

The temperature and a current feedback are driving forces of the oscillations in the thermal insulating device. Unlike existing oscillators, the neuron oscillator eliminates the requirement of an additional compensation circuitry for a consistent performance over a time under heating issues. Additionally, an area scalability and a thermal engineering helps to improve ON/OFF ratio of the neuron oscillator to a broader resistor range. Further, a presence of tunable synaptic memristor functionality of the neuron oscillator provides a reduced fabrication complexity to a large scale ONN.

An input voltage required for the neuron oscillator is low (2-3 V) which makes it suitable to use with existing circuitries without using any additional converters. Additionally, an amplitude of the oscillations is a significant fraction of an applied bias which eliminates a need for an amplification, since most of supplied power drives the oscillations as opposed to other high voltage device level oscillators with a small input to output-signal conversion ratio. Further, parameters like a power density (~0.01 mW/μm²) and a maximum oscillating frequency (~1 MHz), of the neuron oscillator is comparable with the existing oscillators.

Referring now to the drawings, and more particularly to FIGS. 2a through 6, there are shown preferred embodiments.

Figure 2A:
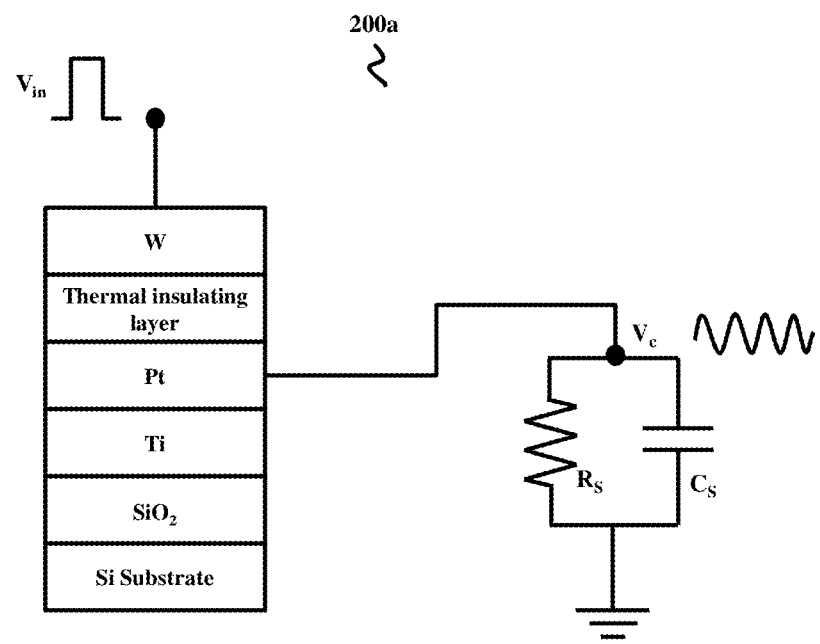
FIG. 2a is a circuit diagram of a neuron oscillator including a thermal insulating device connected in series with a resistor and a capacitor, according to an embodiment as disclosed herein.

FIG. 2a is a circuit diagram of a neuron oscillator 200a including a thermal insulating device connected in series with a resistor $R_S$ and a capacitor $C_S$, according to an embodiment as disclosed herein. The neuron oscillator 200a includes the thermal insulating device connected with one end of the resistor $R_S$ and the capacitor $C_S$ in series to produce a self-sustained oscillations, where the resistor $R_S$ and the capacitor $C_S$ are arranged in parallel manner.

In an embodiment, the thermal insulating device includes a silicon (Si) substrate, where the Si substrate is thermally oxidized by a thermal oxidation process at a temperature to grow a silicon oxide ($SiO_2$). Further, the thermal insulating device includes a titanium (Ti) and a platinum (Pt) deposited on the silicon oxide by a sputtering process in an argon ambient. Further, the thermal insulating device includes a thermal insulating layer deposited by a radio frequency (RF) sputtering in an argon ambient at a room temperature. Further, the thermal insulating device includes a tungsten (W) placed on the thermal insulating layer as a top contact, by a photolithography and a lift-off process.

In embodiment, germanium or combination of silicon and germanium is used as the substrate. The temperature of the thermal oxidation process is 1000 degree Celsius (i.e., 1000° C.).

In an embodiment, the titanium and the platinum act as a bottom contact for the thermal insulating layer, where the resistor $R_S$ and the capacitor $C_S$ are connected. The stack of the silicon oxide, the titanium, the platinum, and the thermal insulating layer is annealed at 750° C. in a nitrogen ambient.

In an embodiment, the thermal insulating layer is at least one of a praseodymium manganese oxide ($PrMnO_3$ or PMO) layer, praseodymium calcium manganese oxide ($PrCaMnO_3$) layer, a calcium manganese oxide ($CaMnO_3$) layer, and a lanthanum strontium manganite oxide (LSMO) layer.

In an embodiment, the thermal insulating layer generates a transient joule heating based hysteretic thermal runaway in its DC I-V characteristics. In an embodiment, the transient joule heating based hysteretic thermal runaway is caused due to minimal heat loss in the thermally insulating device.

In an embodiment, the bottom contact of the thermal insulating device is connected to one terminal of the parallel connection of the resistor $R_S$ and the capacitor $C_S$.

In an embodiment, an input voltage $V_{in}$ for the neuron oscillator 200a is given by providing the input voltage $V_{in}$ across the top contact of the thermal insulating device and other terminal of the parallel connection of the resistor $R_S$ and the capacitor $C_S$. The input voltage $V_{in}$ for the neuron oscillator 200a is in a pulse form.

In an embodiment, the self-sustained oscillations of the neuron oscillator 200a is a voltage $V_C$ obtained across the capacitor $C_S$. An output voltage of the neuron oscillator 200a is the voltage $V_C$ obtained across the capacitor $C_S$. The voltage $V_C$ across the capacitor $C_S$ determines the voltage across the thermal insulating device so as to generate a low resistance state $R_L$ and a high resistance state $R_H$.

In an embodiment, the low resistance state $R_L$ of the thermal insulating device generates a charging of the capacitor $C_S$ and the high resistance state $R_H$ of the thermal insulating device generates a discharging of the capacitor $C_S$ resulting in the oscillations in the neuron oscillator 200a.

In an embodiment, the neuron oscillator 200a is used in a coupled oscillatory neural network. In an embodiment, the neuron oscillator 200a is used in a neuromorphic application.

In an embodiment, the neuron oscillator 200a is based on a transient heating cooling of a nanoscale device. The neuron oscillator 200a enables a formation of ONNs. Such ONNs can be used to solve NP Hard problems (used in cryptography). Further, such artificial neurons (neuron oscillator 200a) provides major improvements in artificial intelligence (AI) performance.

Figure 2B:
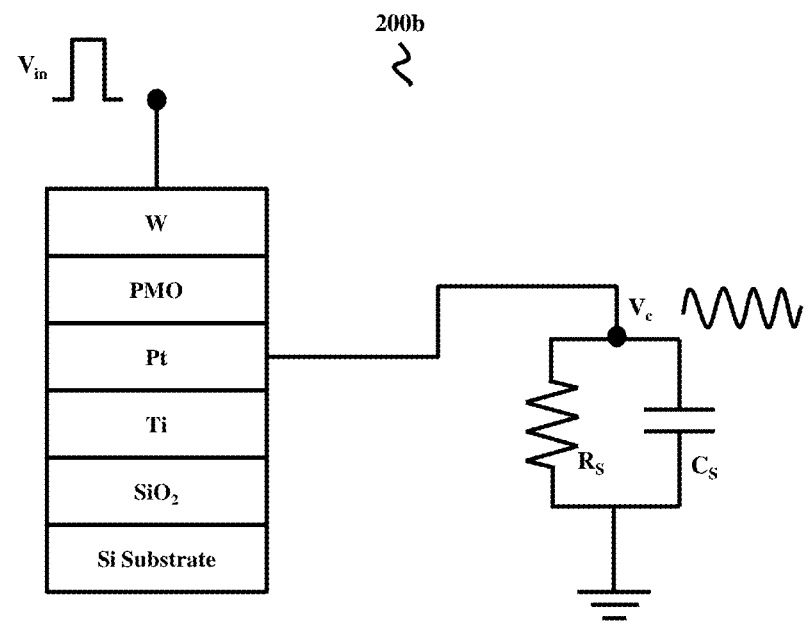
FIG. 2b is a circuit diagram of the neuron oscillator including a PMO device connected in series with the resistor and the capacitor, according to an embodiment as disclosed herein.

FIG. 2b is a circuit diagram of a neuron oscillator 200b including the PMO device connected in series with the resistor $R_S$ and the capacitor $C_S$, according to an embodiment as disclosed herein. In an example, the PMO device is fabricated on a 4 inch Si <100> substrate. The substrate is thermally oxidized by a rapid thermal oxidation process at 1000° C. to grow the $SiO_2$ of 40 nm thickness. The Ti of 25 nm thickness and the Pt of 150 nm thickness is deposited on the $SiO_2$ as the bottom contact of the PMO device, by the sputtering in the argon ambient. Further, the PMO layer of ~65 nm thickness is deposited by the RF sputtering in the argon ambient at room temperature on the Pt. Further, the stack of the $SiO_2$, the Ti, the Pt, and the PMO layer is annealed at 750° C. in the nitrogen ambient for 30 s. Further, the W having a diameter 5 μm placed on the PMO layer as a top contact, by the photolithography and the lift-off process.

In an embodiment, the PMO device is fabricated to achieve the transient joule heating based hysteretic thermal runaway in its DC I-V characteristics. In the neuron oscillator 200b, a high thermal insulation slows down a heat loss (i.e. the heat is retained in the PMO device) which leads to a positive feedback between the temperature and a current beyond a threshold voltage. Due to the positive feedback, the current rises sharply to give very high non-linearity. The high non-linearity provides two volatile resistance states including the high resistance state $R_H$ and the low resistance state $R_L$.

In an embodiment, the PMO device is connected in series with a parallel combination of the resistor $R_S$ and the capacitor $C_S$ to make the neuron oscillator 200b. The voltage $V_C$ across the capacitor $C_S$ determines the voltage across the PMO device and hence the resistance states (the high resistance state $R_H$ and the low resistance state $R_L$).The change in resistance states leads to the charging and the discharging of the capacitor $C_S$ resulting in the oscillations. The joule heating based operation of the PMO device allows the neuron oscillator 200b to oscillate below 3V. An oscillation frequency is changed using input voltage $V_{in}$, the resistor $R_S$ and the capacitor $C_S$ values. In the neuron oscillator 200b, the thermal engineering can improve the high resistance state $R_H$, the low resistance state $R_L$, a high threshold voltage $V_H$ to lower threshold voltage $V_H$ ratio. Further, the neuron oscillator 200b can be used in coupled oscillatory neural network to solve classification problems and the NP hard problems.

In an embodiment, $Pr_{1-x}Mn_xCaO_3$ with different 'x' can be used to make neuron oscillator 200b. In another embodiment, any other semiconducting material can be used instead of the PMO device, by appropriately selecting a ratio of the thickness of a material and a thermal conductivity as per Fourier heat equation.

Figure 3A:
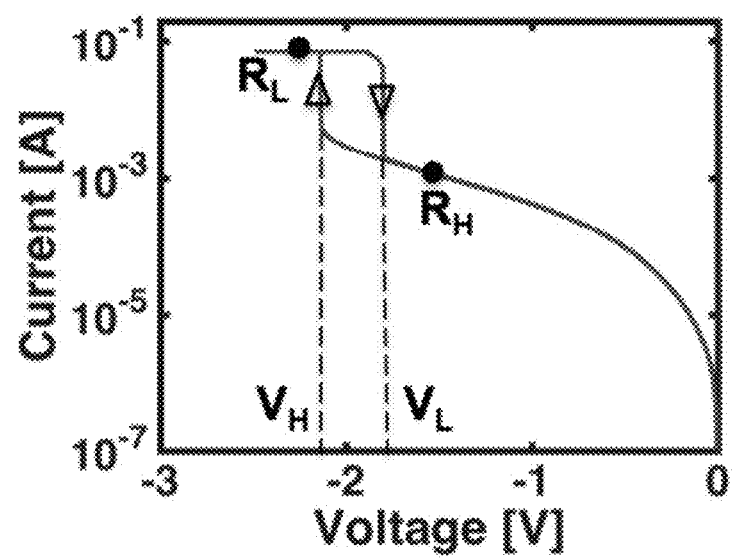
FIG. 3a illustrates a hysteresis loop in a DC I-V characteristics of the PMO device, according to an embodiment as disclosed herein.

FIG. 3a illustrates a hysteresis loop in a DC I-V characteristics of the PMO device, according to an embodiment as disclosed herein. The PMO device (e.g., PMO based RRAM device) is a non-filamentary material and is semiconducting in nature. The DC I-V characteristics of the PMO device in negative polarity is shown in the FIG. 3a. Initially, the PMO device is in an OFF state or the high resistance state $R_H$ at zero applied bias. Upon changing the input voltage $V_{in}$ from 0 to −2.5V with a compliance of 10 mA, an abrupt current increase is generated beyond the high threshold voltage $V_H$ (∼−2.2V). As long as the bias is high, the PMO device stays in the ON state or the low resistance state $R_L$. Upon changing input voltage from −2.5V to 0V, the PMO device moves into the OFF state below the lower threshold voltage ($V_L$∼−1.8V) and produces a hysteresis loop in the DC I-V characteristics. An abrupt switching in the DC characteristics is due to an intrinsic joule heating in the PMO device.

In an example, a DC measurement is carried out using Agilent B1500A/B1530A semiconductor analyzer.

Figure 3B:
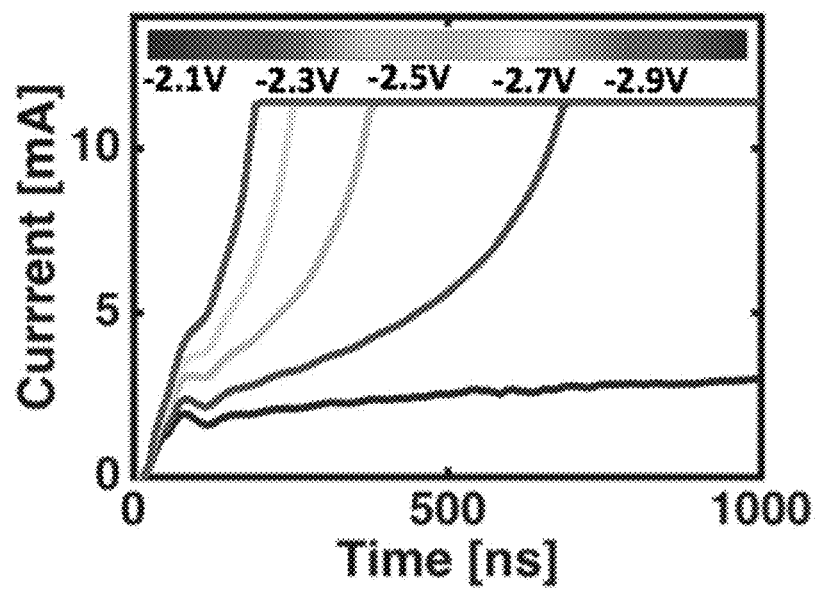
FIG. 3b illustrates a transient current response of the PMO device, according to an embodiment as disclosed herein.

FIG. 3b illustrates a transient current response of the PMO device, according to an embodiment as disclosed herein. As the transient joule heating depends on a critical power density in the PMO device (current density×voltage), a transient joule heating timescale (transient measurements) reduces with an increment in the input voltage $V_{in}$. Further, the switching speed (<50 ns) of the PMO device is higher.

Figure 4A:
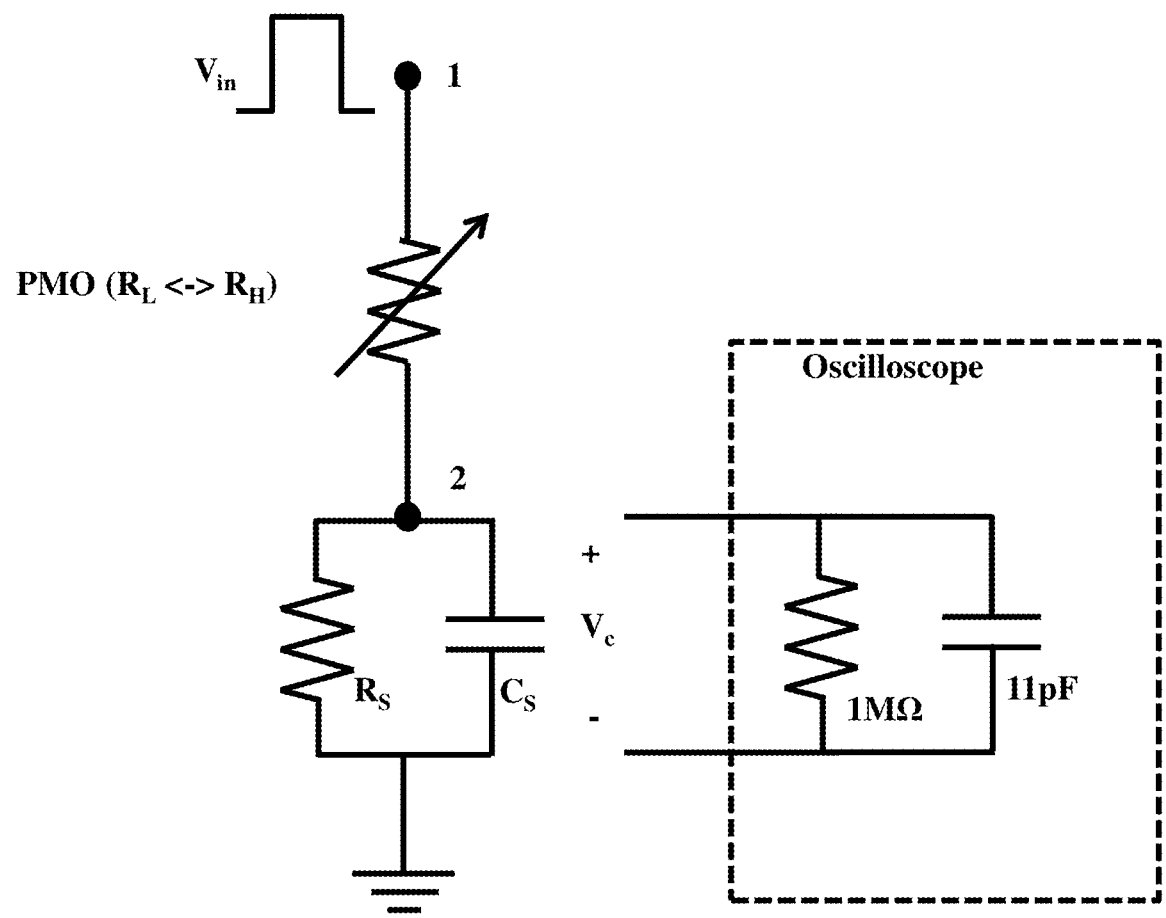
FIG. 4a is a circuit diagram for monitoring a voltage across the capacitor using a oscilloscope, according to an embodiment as disclosed herein.

FIG. 4a illustrating a circuit diagram for monitoring the voltage $V_C$ across the capacitor $C_S$ using a oscilloscope, according to an embodiment as disclosed herein. The hysteresis loop in the DC I-V characteristics is used for generating an oscillatory neuronal behavior of the neuron oscillator 200b. The PMO device is connected in series with the resistor $R_S$ and the capacitor $C_S$. As the PMO device has two fixed resistance states the low resistance state $R_L$ and the high resistance state $R_H$ (as shown in FIG. 3a), the voltage $V_C$ across the $C_S$ have two steady states $V_{C1}$ (equation-1) and $V_{C2}$ (equation-2) respectively. A potential division as follows:

$$V_{C1} = V_{in}\left(\frac{R_S}{R_S + R_L}\right) \quad \text{equation-1}$$

$$V_{C2} = V_{in}\left(\frac{R_S}{R_S + R_H}\right) \quad \text{equation-2}$$

Figure 4B:
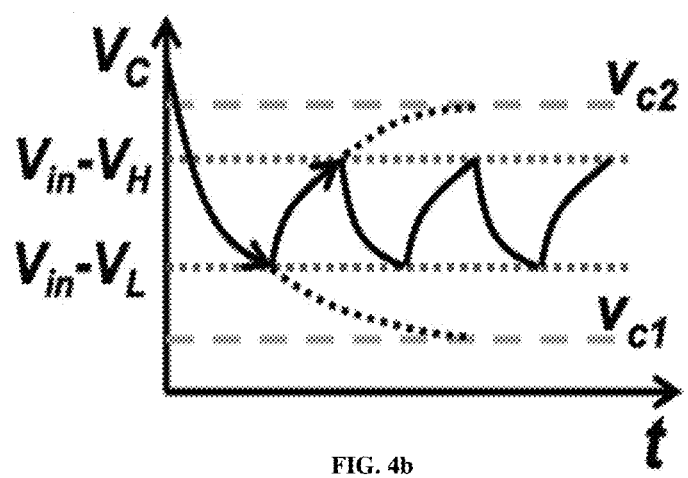
FIG. 4b is a graph of the voltage across the capacitor as a function of time which shows steady states of the PMO device included in the neuron oscillator, according to an embodiment as disclosed herein.

FIG. 4b is a graph of the voltage across the capacitor $C_S$ as a function of time which shows steady states of the PMO device included in the neuron oscillator 200b, according to an embodiment as disclosed herein. when the input voltage $V_{in}$ in the pulse form is (at time t=0) is given to the neuron oscillator 200b, the capacitor $C_S$ is uncharged. All the potential drops across the PMO device. Since $|V_{in}|>|V_H|$, the PMO device switches from the high resistance state $R_H$ to the low resistance state $R_L$ and the capacitor $C_S$ charges. Gradually, the voltage $V_C$ across the capacitor $C_S$ rises and a voltage across the PMO device falls below the lower threshold voltage $V_L$. Further, the PMO device switches back from the low resistance state $R_L$ to the high resistance state $R_H$. Further, the capacitor $C_S$ initiates to discharge via the resistor $R_S$. The capacitor charge is low enough, such that the voltage across the PMO device exceeds the higher threshold voltage $V_H$, the low resistance state $R_L$ is activated again to charge back the capacitor $C_S$ and this cycle keeps on repeating as shown in FIG. 4b to obtain the self-sustained oscillations.

The PMO device oscillates in a region of an operation defined between the two threshold voltages ($V_L$ and $V_H$) or equivalently the voltage $V_C$ oscillates in between $V_{in}$−$V_H$ and $V_{in}$−VL, an exact time evolution of which follows equation-3 for charging and equation-4 for discharging.

$$V_C = V_{C1} + (V_{in} - V_H - V_{C1})e^{-\frac{1}{C}\left(\frac{1}{R_S}+\frac{1}{R_L}\right)t} \quad \text{equation-3}$$

$$V_C = V_{C2} + (V_{in} - V_H - V_{C2})e^{-\frac{1}{C}\left(\frac{1}{R_S}+\frac{1}{R_H}\right)t} \quad \text{equation-4}$$

The above analysis is exact when an external Resistor-capacitor (RC) timescales are much larger than an intrinsic thermal timescales and the switching is happened abruptly according to exceeding the threshold voltages (lower threshold voltage $V_L$ and higher threshold voltage $V_H$). The transient response (equation-3 and equation-4) indicates that an oscillation frequency of the neuron oscillator 200b is dependent on the input voltage $V_{in}$, the resistor $R_S$ and the capacitor $C_S$.

Figure 4C:
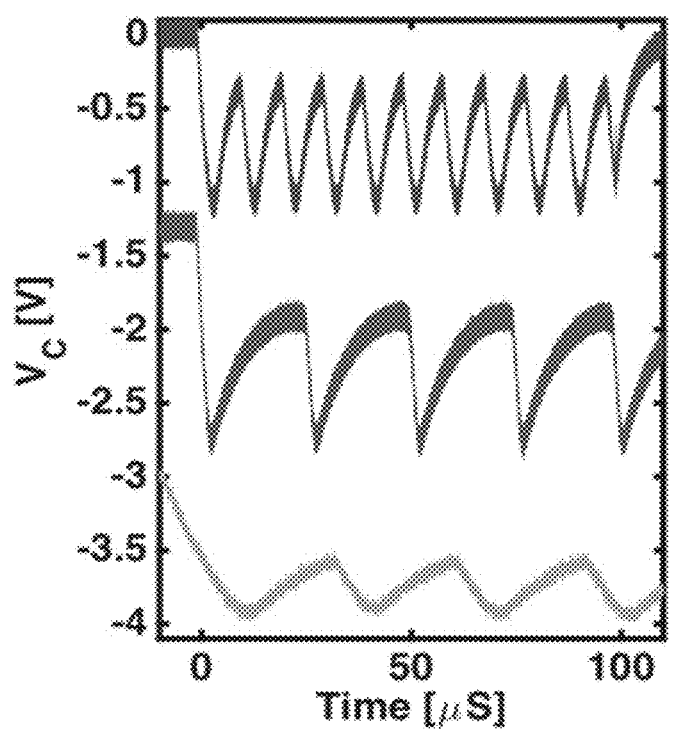
FIG. 4c illustrates an oscillation frequency of the neuron oscillator for different resistor and capacitor combinations, according to an embodiment as disclosed herein.

FIG. 4c illustrates the oscillation frequency of the neuron oscillator 200b for different resistor and capacitor combinations, according to an embodiment as disclosed herein. A RC dependent oscillation frequency modulation is captured experimentally in FIG. 4c. The oscillation frequencies for different RC combinations is given below:

For, resistor $R_S$=50Ω, capacitor $C_S$=100 nF, then oscillation frequency=100 kHz (top waveform).

For, resistor $R_S$=170Ω, capacitor $C_S$=100 nF, then oscillation frequency=40 kHz (middle waveform)).

For, resistor $R_S$=50Ω, capacitor $C_S$=700 nF, then oscillation frequency=33 kHz (bottom waveform).

Figure 5B:
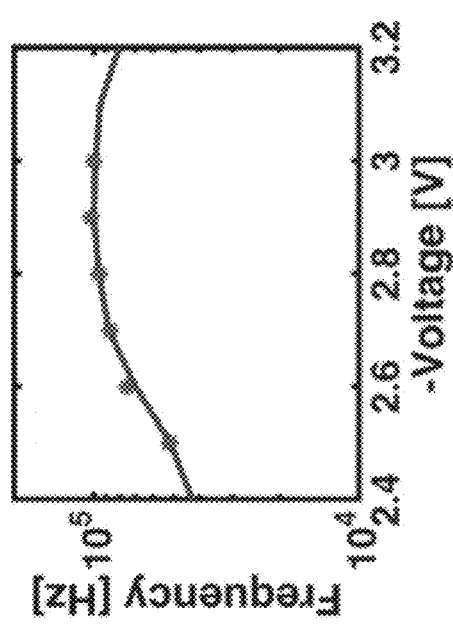
FIG. 5b is a graph of the oscillation frequency as the function of an input voltage, where the behavioral circuit model of the neuron oscillator is developed using the Verilog-A, according to an embodiment as disclosed herein.
Figure 5D:
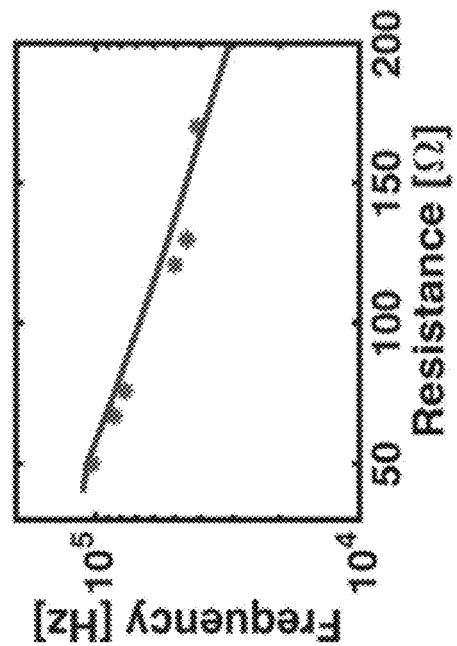
FIG. 5d is a graph of the oscillation frequency as the function of the value of the resistor, where the behavioral circuit model of the neuron oscillator is developed using the Verilog-A, according to an embodiment as disclosed herein.
Figure 5A:
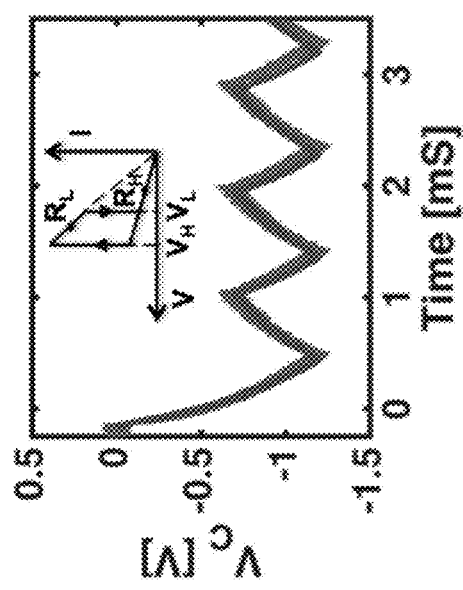
FIG. 5a is a graph of the voltage across the capacitor as the function of the time, where a behavioral circuit model of the neuron oscillator is developed using Verilog-A, according to an embodiment as disclosed herein.

FIG. 5a is a graph of the voltage $V_C$ across the capacitor $C_S$ as the function of the time, where a behavioral circuit model of the neuron oscillator 200b is developed using Verilog-A, according to an embodiment as disclosed herein. In an example, the behavioral circuit model is developed using the Verilog-A and simulations are performed in Cadence Virtuoso. The hysteretic loop in DC I-V characteristics is used to model the PMO device as shown FIG. 5a. The model device has two stable resistance states (i.e., the low resistance state $R_L$ and the high resistance state $R_H$). Further, the switching happens linearly over a heating/cooling timescale at respective threshold voltages (lower threshold voltage $V_L$ and higher threshold voltage $V_H$). The external inputs are the input voltage $V_{in}$, the resistor $R_S$ and the capacitor $C_S$ values. The model device captures an effect of an external input on an oscillator performance. Further, the oscillations using Verilog-A model and experimental oscillations are matched.

FIG. 5b is a graph of the oscillation frequency as the function of an input voltage $V_{in}$, where the behavioral circuit model of the neuron oscillator 200b is developed using the Verilog-A, according to an embodiment as disclosed herein. As input voltage $V_{in}$ is increased, the oscillation frequency initially increases and then saturates. The switching threshold voltages (lower threshold voltage $V_L$ and higher threshold voltage $V_H$) must lie within a window of steady states $V_{C1}$ and $V_{C2}$ for the oscillations to occur.

Figure 5C:
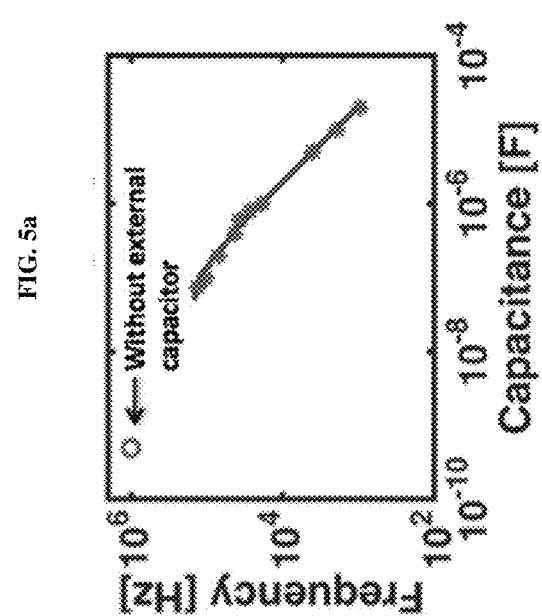
FIG. 5c is a graph of the oscillation frequency as the function of a value of the capacitor, where the behavioral circuit model of the neuron oscillator is developed using the Verilog-A, according to an embodiment as disclosed herein.

FIG. 5c is a graph of the oscillation frequency as the function of the value of the capacitor $C_S$, where the behavioral circuit model of the neuron oscillator 200b is developed using the Verilog-A, according to an embodiment as disclosed herein. The oscillation frequency decreases upon increasing the value of the capacitor $C_S$ due to increasing timescales for the charging/discharging. The simulations also predict the theoretical oscillation limit of ~1 MHz limited by the intrinsic thermal timescale.

FIG. 5d is a graph of the oscillation frequency as the function of the value of the resistor $R_S$, where the behavioral circuit model of the neuron oscillator 200b is developed using the Verilog-A, according to an embodiment as disclosed herein. The oscillation frequency decreases upon increasing the value of the resistor $R_S$ due to increasing the timescales for the charging/discharging. The simulations also predict the theoretical oscillation limit of ~1 MHz limited by the intrinsic thermal timescale.

Figure 6:
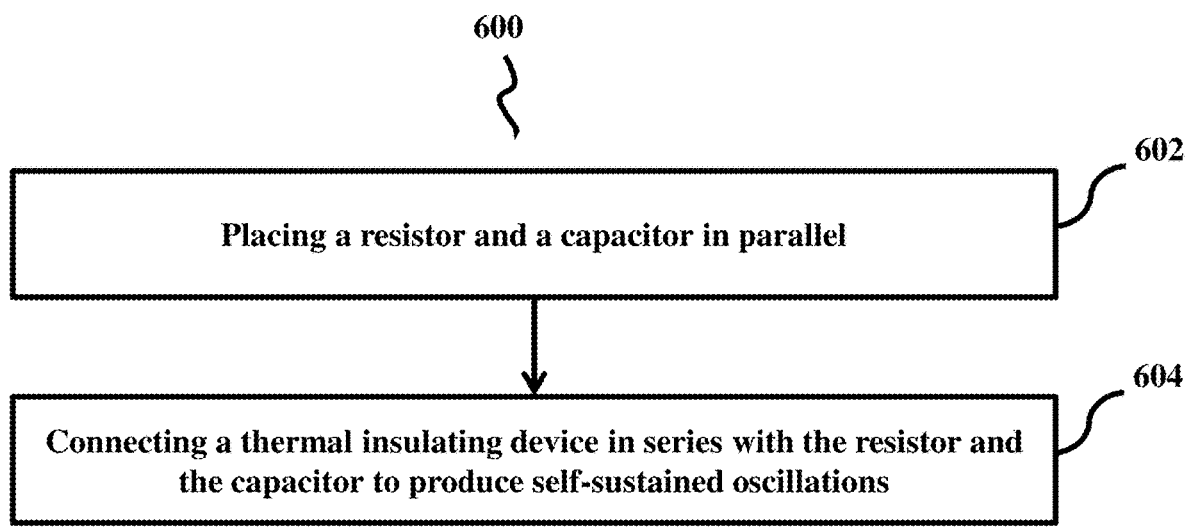
FIG. 6 is a flow diagram illustrating a method for fabricating the neuron oscillator, according to an embodiment as disclosed herein.

FIG. 6 is a flow diagram 600 illustrating a method for fabricating the neuron oscillator 200a, according to an embodiment as disclosed herein. At 602, the method includes placing the resistor $R_S$ and the capacitor $C_S$ in parallel. At 604, the method includes connecting the thermal insulating device in series with the resistor $R_S$ and the capacitor $C_S$ to produce self-sustained oscillations. The benchmarking of the neuron oscillator 200b with existing oscillators is shown in Table-1.

TABLE 1

| Reference | Physics | Area scalable | Synapse $V_{in}$ availability | $V_{OSC}/V_{in}$ |
|---|---|---|---|---|
| $TaO_x$ | Conductive filament | No | 7 No | 4/7 (57%) |
| $VO_2$ | MIT | Yes | 9 No | 0.5/9 (5.5%) |
| $NbO_2$ | MIT | Yes | 4 No | 0.2/4 (5%) |
| Magnetic oscillator | Spin-torque based magnetic switching | Yes | 0.5 No | 0.02/0.5 (4%) |
| Neuron oscillator | Joule heating | Yes | 2.5 Yes | 0.7/2.5 (28%) |

As shown in the table 1, in neuron oscillator 200b, a temperature and a current feedback are driving force of the oscillations in the PMO device. In neuron oscillator 200b, the temperature and the current feedback is the driving force of oscillations in PMO devices whereas other device level oscillator demonstrations (MIT or phase transition) need to develop a temperature tolerance for a consistent performance over time due to heating issues, which in a worst case may result in requiring additional compensation circuitry. Additionally, an area scalability and a thermal engineering helps to improve ON/OFF ratio of the neuron oscillator 200b to a broader resistor $R_S$ range of feasible operation. Further, a presence of tunable synaptic memristor functionality of the neuron oscillator 200b provides a reduced fabrication complexity to a large scale ONN.

The input voltage required for the neuron oscillator 200b is low (2-3 V) which makes it suitable to use with existing circuitries without using any additional converters. Additionally, an amplitude of the oscillations is a significant fraction of an applied bias which eliminates a need for an amplification, since most of supplied power drives the oscillations as opposed to other high voltage device level oscillators with a small input to output-signal conversion ratio. Further, parameters like a power density (~0.01 mW/$\mu m^2$) and a maximum frequency (~1 MHz), of the neuron oscillator 200b is comparable with the existing oscillators.

Unlike other demonstrations based on complex ionic motion or MIT or volatile conductive filamentation, the neuron oscillator 200b is proposed based on a novel transient joule heating based a non-linearity in the PMO device enabling a hysteretic switching element in a single device equivalent of a complex analog circuit like a Schmitt trigger.

A composition engineering allows synapse facility required for dense integration of neural networks while thermal engineering allows control over DC I-V and reduced a power consumption in better thermal structures. With oscillations observed at sub-3V biases, a significant high to low resistance ratio along with the thermal engineering and a synapse availability in the same material system makes the neuron oscillator 200b to build large-scale ONNs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A neuron oscillator, comprising
a thermal insulating device connected with a resistor and a capacitor in series to produce self-sustained oscillations, wherein the resistor and the capacitor are arranged in parallel manner, wherein a thermal insulating layer generates a transient joule heating based hysteretic thermal runaway in its direct-current current-voltage (DCIV) characteristics, wherein the transient joule heating based hysteretic thermal runaway is caused due to high thermal resistivity with respect to Silicon in the thermally insulating device, wherein the thermal insulating device comprises:
a substrate, where the silicon substrate is thermally oxidized by a thermal oxidation process at a temperature to grow a silicon oxide layer;
a titanium layer and a platinum layer deposited on the silicon oxide layer by a sputtering process in an argon ambient;
a thermal insulating layer deposited by a radio frequency (RF) sputtering in an argon ambient at a room temperature; and
a tungsten top-contact patterned layer placed on the thermal insulating layer by photolithography and lift-off process.

2. The neuron oscillator of claim 1, wherein the temperature of the thermal oxidation process is 1000 degree Celsius.

3. The neuron oscillator of claim 1, wherein the titanium layer and the platinum layer act as a bottom contact for the thermal insulating layer.

4. The neuron oscillator of claim 1, wherein a stack of the silicon oxide layer, the titanium layer, the platinum layer, and the thermal insulating layer is annealed at 750 degree Celsius in a nitrogen ambient.

5. The neuron oscillator of claim 1, wherein the thermal insulating device comprises at least one of a praseodymium manganese oxide ($PrMnO_3$) device, praseodymium calcium manganese oxide (PrCaMnO$_3$) device, a calcium manganese oxide (CaMnO$_3$) device, and a lanthanum strontium manganite oxide (LSMO).

6. The neuron oscillator of claim 1, wherein a voltage across the capacitor determines the voltage across the thermal insulating device so as to generate a low resistance state and a high resistance state.

7. The neuron oscillator of claim 6, wherein the low resistance state of the thermal insulating device generates charging and the high resistance state of the thermal insulating device generates discharging of the capacitor resulting in oscillations in the neuron oscillator.

8. The neuron oscillator of claim 1, wherein the neuron oscillator is used in a coupled oscillatory neural network.

9. The neuron oscillator of claim 8, wherein the neuron oscillator is used in a neuromorphic application.

10. A method for fabricating a neuron oscillator, comprising
placing a resistor and a capacitor in parallel; and
connecting a thermal insulating device in series with the resistor and the capacitor to produce self-sustained oscillations,
wherein a thermal insulating layer generates a transient joule heating based hysteretic thermal runaway in its direct-current current voltage (DCIV) characteristics, and wherein the transient joule heating based hysteretic thermal runaway is caused due to high thermal resistivity with respect to Silicon in the thermally insulating device, wherein the thermal insulating device is fabricated by:
placing a silicon substrate, where the substrate is thermally oxidized by a thermal oxidation process at a temperature to grow a silicon oxide;
depositing a titanium layer and a platinum layer on the silicon oxide by a sputtering process in an argon ambient;
depositing a thermal insulating layer by a radio frequency (RF) sputtering in the argon ambient at a room temperature; and
placing a tungsten top-contact patterned layer on the thermal insulating layer by photolithography and lift-off process.

11. The method of claim 10, wherein the temperature of thermal oxidation is 1000 degree Celsius.

12. The method of claim 10, wherein the titanium layer and the platinum layer act as a bottom contact for the thermal insulating layer.

13. The method of claim 10, wherein a stack of the silicon oxide layer, the titanium layer, the platinum layer, and the thermal insulating layer is annealed at 750 degree Celsius in a nitrogen ambient.

14. The method of claim 10, wherein the thermal insulating device comprises at least one of a praseodymium manganese oxide (PMO) device, a praseodymium calcium manganese oxide (PrCaMnO3) device, a calcium manganese oxide (CaMnO3) device, and a lanthanum strontium manganite oxide (LSMO).

15. The method of claim 10, wherein a voltage across the capacitor determines the voltage across the thermal insulating device so as to generate a low resistance state and a high resistance state.

16. The method of claim 15, wherein the low resistance state of the thermal insulating device generates charging and the high resistance state of the thermal insulating device generates discharging of the capacitor resulting in oscillations in the neuron oscillator.

17. The method of claim 10, wherein the neuron oscillator is used in a coupled oscillatory neural network.

18. The method of claim 10, wherein the neuron oscillator is used in a neuromorphic application.

* * * * *